(12) United States Patent
Khan et al.

(10) Patent No.: US 10,179,941 B1
(45) Date of Patent: Jan. 15, 2019

(54) GAS DELIVERY SYSTEM FOR HIGH PRESSURE PROCESSING CHAMBER

(71) Applicant: Micromaterials LLC, Wilmington, DE (US)

(72) Inventors: Adib M. Khan, Santa Clara, CA (US); Qiwei Liang, Fremont, CA (US); Sultan Malik, Sacramento, CA (US); Keith Tatseun Wong, Los Gatos, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/835,378

(22) Filed: Dec. 7, 2017

Related U.S. Application Data

(60) Provisional application No. 62/532,715, filed on Jul. 14, 2017.

(51) Int. Cl.
| | |
|---|---|
| *H01L 21/00* | (2006.01) |
| *C21D 1/773* | (2006.01) |
| *H01L 21/67* | (2006.01) |
| *H01L 21/02* | (2006.01) |

(Continued)

(52) U.S. Cl.
CPC ........ *C21D 1/773* (2013.01); *H01L 21/02337* (2013.01); *H01L 21/31111* (2013.01); *H01L 21/324* (2013.01); *H01L 21/67109* (2013.01)

(58) Field of Classification Search
CPC ......... H01L 21/02337; H01L 21/31111; H01L 21/324; H01L 21/67109
See application file for complete search history.

(56) References Cited

U.S. PATENT DOCUMENTS

| | | |
|---|---|---|
| 5,114,513 A | 5/1992 | Hosokawa et al. |
| 5,149,378 A | 9/1992 | Ohmi et al. |
| 5,319,212 A | 6/1994 | Tokoro |

(Continued)

FOREIGN PATENT DOCUMENTS

| | | |
|---|---|---|
| JP | 2007242791 A | 9/2007 |
| JP | 2013516788 A | 5/2013 |

(Continued)

OTHER PUBLICATIONS

International Search Report and Written Opinion for PCT/US2018/037539 dated Oct. 5, 2018.

(Continued)

*Primary Examiner* — Richard Booth
(74) *Attorney, Agent, or Firm* — Patterson + Sheridan, LLP

(57) ABSTRACT

A high-pressure processing system includes a first chamber, a second chamber adjacent the first chamber, a foreline to remove gas from the second chamber, a vacuum processing system configured to lower a pressure within the second, a valve assembly to isolate the pressure within the first chamber from the pressure within the second chamber, a gas delivery system configured to introduce a gas into the first chamber and to increase the pressure within the first chamber to at least 10 atmospheres, an exhaust line to remove gas from the first chamber, and a containment enclosure surrounding a portion of the gas delivery system and the exhaust line to divert gas leaking from the portion of the gas delivery system and the exhaust line to the foreline.

18 Claims, 5 Drawing Sheets

(51) Int. Cl.
*H01L 21/311* (2006.01)
*H01L 21/324* (2006.01)

(56) References Cited

U.S. PATENT DOCUMENTS

| | | |
|---|---|---|
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,150,286 A | 11/2000 | Sun et al. |
| 6,242,368 B1 | 6/2001 | Holmer et al. |
| 6,251,751 B1 | 6/2001 | Chu et al. |
| 6,319,766 B1 | 11/2001 | Bakli et al. |
| 6,500,603 B1 | 12/2002 | Shioda |
| 6,797,336 B2 | 9/2004 | Garvey et al. |
| 7,460,760 B2 | 12/2008 | Cho et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,867,923 B2 | 1/2011 | Mallick et al. |
| 8,027,089 B2 | 9/2011 | Hayashi |
| 8,318,584 B2 | 11/2012 | Li et al. |
| 8,349,085 B2 | 1/2013 | Tahara et al. |
| 8,449,942 B2 | 5/2013 | Liang et al. |
| 8,481,123 B2 | 7/2013 | Kim et al. |
| 8,557,712 B1 | 10/2013 | Antonelli et al. |
| 8,741,788 B2 | 6/2014 | Liang et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,257,314 B1 | 2/2016 | Rivera et al. |
| 9,306,026 B2 | 4/2016 | Toriumi et al. |
| 9,484,406 B1 | 11/2016 | Sun et al. |
| 9,570,551 B1 | 2/2017 | Balakrishnan et al. |
| 2001/0029108 A1 | 10/2001 | Tometsuka |
| 2001/0041122 A1 | 11/2001 | Kroeker |
| 2002/0151128 A1 | 10/2002 | Lane et al. |
| 2003/0030945 A1 | 2/2003 | Heinonen et al. |
| 2003/0207593 A1 | 11/2003 | Derderian et al. |
| 2004/0060519 A1 | 4/2004 | Beauchaine et al. |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0191828 A1 | 9/2005 | Al-Bayati et al. |
| 2006/0226117 A1 | 10/2006 | Bertram et al. |
| 2006/0290017 A1 | 12/2006 | Yanagisawa |
| 2007/0187386 A1 | 8/2007 | Kim et al. |
| 2008/0074658 A1 | 3/2008 | Davis et al. |
| 2008/0210273 A1 | 9/2008 | Joe |
| 2009/0186481 A1 | 7/2009 | Suzuki et al. |
| 2009/0243126 A1 | 10/2009 | Washiya et al. |
| 2010/0173495 A1 | 7/2010 | Thakur et al. |
| 2010/0304027 A1 | 12/2010 | Lee et al. |
| 2010/0327422 A1 | 12/2010 | Lee et al. |
| 2012/0142192 A1 | 6/2012 | Li et al. |
| 2012/0252210 A1 | 10/2012 | Tohnoe |
| 2012/0285492 A1 | 11/2012 | Lee et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0138802 A1 | 5/2014 | Starostine et al. |
| 2014/0231384 A1 | 8/2014 | Underwood et al. |
| 2014/0264237 A1 | 9/2014 | Chen et al. |
| 2014/0284821 A1 | 9/2014 | Hubbard |
| 2015/0050807 A1 | 2/2015 | Wu et al. |
| 2015/0159272 A1 | 6/2015 | Yoon et al. |
| 2015/0255581 A1 | 9/2015 | Lin et al. |
| 2015/0309073 A1 | 10/2015 | Mirkin et al. |
| 2015/0364348 A1 | 12/2015 | Park et al. |
| 2016/0035600 A1* | 2/2016 | Rivera ............... H01L 21/67098 95/8 |
| 2016/0064482 A1 | 3/2016 | Hashemi et al. |
| 2016/0076149 A1 | 3/2016 | Yamazaki et al. |
| 2016/0118391 A1 | 4/2016 | Zhao et al. |
| 2016/0208414 A1 | 7/2016 | Odawara et al. |
| 2016/0260526 A1 | 9/2016 | Otto |
| 2016/0334162 A1* | 11/2016 | Kim ..................... F26B 21/145 |
| 2016/0353522 A1 | 12/2016 | Rathi et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2018/0019249 A1 | 1/2018 | Zhang et al. |

FOREIGN PATENT DOCUMENTS

| | | |
|---|---|---|
| JP | 2014019912 A | 2/2014 |
| KR | 20070075383 | 7/2007 |
| KR | 1020090040867 A | 4/2009 |
| KR | 20140003776 A | 1/2014 |
| KR | 20150122432 A | 11/2015 |

OTHER PUBLICATIONS

International Search Report and Written Opinion from PCT/US2018/034036 dated Aug. 24, 2018.

International Search Report and Written Opinion dated Aug. 24, 2018 for Application No. PCT/US2018/034284.

International Search Report, Application No. PCT/US2018/028258 dated Aug. 9, 2018.

International Search Report and Written Opinion for PCT/US2018/035210 dated Aug. 24, 2018.

International Search Report and Written Opinion for PCT/US2018/038822 dated Oct. 26, 2018.

* cited by examiner

GAS DELIVERY SYSTEM FOR HIGH PRESSURE PROCESSING CHAMBER

CROSS-REFERENCE TO RELATED APPLICATIONS

This application claims priority to U.S. Application Ser. No. 62/532,715, filed on Jul. 14, 2017, the entire disclosure of which is incorporated by reference.

TECHNICAL FIELD

This invention relates to a high pressure processing chamber, e.g., for annealing, deposition or etching processes during integrated circuit fabrication.

BACKGROUND

Micro-electronic circuits and other micro-scale devices are generally manufactured from a substrate or wafer, such as a silicon or other semiconductor material wafer. Multiple metal layers are applied onto the substrate to form micro-electronic or other micro-scale components or to provide electrical connections. These metal layers, e.g., copper, are plated onto the substrate, and form the components and interconnects in a sequence of photolithographic, plating, etching, polishing, or other steps.

To achieve desired material properties the substrate is typically put through an annealing process in which the substrate is quickly heated, usually to about 200-500° C. The substrate may be held at these temperatures for a relatively short time, e.g., 60-300 seconds. The substrate is then rapidly cooled, with the entire process usually taking only a few minutes. Annealing may be used to change the material properties of the layers on the substrate. It may also be used to activate dopants, drive dopants between films on the substrate, change film-to-film or film-to-substrate interfaces, densify deposited films, or to repair damage from ion implantation.

As feature sizes for microelectronic devices and interconnects become smaller, the allowable defect rate decreases substantially. Some defects result from contaminant particles. Other defects can result from incomplete processing of certain regions of the wafer, e.g., failure to grow a film at the bottom of a trench.

Various annealing chambers have been used in the past. In single wafer processing equipment, these annealing chambers typically position the substrate between or on heating and cooling elements, to control the temperature profile of the substrate. However, achieving precise and repeatable temperature profiles, as well as an acceptable level of defects, can present engineering challenges.

SUMMARY

In one aspect, a high-pressure processing system for processing a layer on a substrate includes a first chamber, a second chamber adjacent the first chamber, a foreline to remove gas from the second chamber, a vacuum processing system configured to lower a pressure within the second chamber to near vacuum, a valve assembly between the first chamber and the second chamber to isolate the pressure within the first chamber from the pressure within the second chamber, a gas delivery system configured to introduce a gas into the first chamber and to increase the pressure within the first chamber to at least 10 atmospheres while the gas is in the first chamber and while the first chamber is isolated from the second chamber, a controller configured to operate the gas delivery system and the valve assembly, an exhaust system comprising an exhaust line to remove gas from the first chamber, and a containment enclosure surrounding a portion of the gas delivery system and the exhaust line, the containment enclosure configured to divert gas leaking from the portion of the gas delivery system and the exhaust line to the foreline.

Implementations may include one or more of the following features.

The containment enclosure may be configured to prevent leaking gas leaking to the atmosphere. The foreline may be connected to a dry line pump and a diffuser configured to reduce the pressure of the gas before reaching the dry line pump.

A first pump may be configured to increase pressure of the gas to at least 10 atmospheres, e.g., at least 40 atmospheres, before delivering the gas to the first chamber. The containment enclosure may surround the first pump, and delivery lines connecting the first pump and the first chamber.

A second gas delivery system may be configured to introduce a second gas into the first chamber and to increase the pressure within the first chamber to at least 10 atmospheres while the second gas is in the first chamber and while the first chamber is isolated from the second chamber. The second gas delivery system may include a second pump configured to increase pressure of the second gas to at least 40 atmospheres before delivering the second gas to the first chamber.

The gas delivery system may include a steam delivery system that introduces steam to the first chamber.

One or more chemical sensors, e.g., hydrogen sensors, may be placed inside the containment enclosure, and wherein the controller may be configured to shut off the first pump if the controller receives a signal from one or more of the chemical sensors indicating a chemical leak.

A pedestal to support the substrate may be positioned within the first chamber. A heating element on the pedestal may be configured to apply heat to the substrate and to anneal the substrate when the substrate is supported on the pedestal.

A vacuum processing system may be configured to generate a pressure less than 1 atmosphere within the second chamber.

A robot arm may be configured to transfer the substrate through the valve assembly from the first chamber to the second chamber. The valve assembly may include a slit valve between the first chamber and the second chamber. The slit valve may include a slit through a wall between the first chamber and the second chamber, and an arm movable between a first position in which the arm covers the slit to form a seal between the first chamber and the second chamber and a second position in which the slit is uncovered and the substrate is transferrable through the slit valve from the first chamber to the second chamber. The arm may be configured to engage an inner surface of the wall defining the first chamber in the first position to compress an O-ring an form the seal between the first chamber and the second chamber. An actuator coupled to an end of the arm outside of the second chamber may move the arm relative to the slit. A gas channel may be internal to the arm. The gas channel may be connected to a cooling gas source on a first end.

A lift pin assembly may lift the substrate from the support. A cooling channel may deliver cool gas near the lift pin assembly and cool the lift pin assembly.

In another aspect, a semiconductor fabrication apparatus includes a central vacuum chamber having a robot positioned therein, a factory interface module coupled to the central vacuum chamber, a low-pressure processing chamber coupled to the central vacuum chamber by a first vacuum valve, and the high-pressure deposition system discussed above. The second chamber is coupled to the central vacuum chamber by a second vacuum valve.

Implementations may include one or more of the following advantages.

High pressure can be established in a chamber more safely. Leaks can be detected.

A layer can be treated or formed more uniformly across the substrate. In addition, high-pressure processing can also provide access to chemical reactions that are not available at lower pressures.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

As noted above, some defects can result from incomplete processing of certain regions of a substrate. However, high-pressure processing (e.g., annealing or deposition) can improve consistency of processing across the substrate. In particular, annealing can occur in a high-pressure environment. Where a layer is formed through the annealing process, e.g., by thermal oxidation or other process in which chemistry diffuses into and reacts with the substrate, the high pressure can help improve thoroughness of surface coverage of the layer of material on the substrate. For example, problems of treatment formation of a layer in a trench can be reduced. As a result, a layer can be treated or formed more uniformly across the substrate. In addition, high-pressure processing (e.g., annealing or deposition) can also provide access to chemical reactions that are not available at lower pressures.

Another issue is that certain materials, such as copper, will rapidly oxidize when exposed to oxygen, at temperatures over about 70° C. If the copper or other material oxidizes, the substrate may no longer be useable, or the oxide layer must first be removed before further processing. These are both unacceptable options for efficient manufacturing. Accordingly, a design factor is to isolate the substrate from oxygen, when the substrate temperature is over about 70° C. Since oxygen is of course present in ambient air, avoiding oxidation of copper during annealing also can present engineering challenges. As described herein, the substrate can be transferred between the high-pressure processing chamber and different processing chambers in the low-pressure, e.g., near-vacuum, environment to avoid contamination and oxidation of the substrate.

The temperature uniformity of the wafer is another significant design factor as it affects the crystalline structure of copper or other materials on the wafer. The processing system, e.g., the pedestal configuration, can provide uniform heating of the wafer.

Another consideration is pressure. Very high pressures can improve the consistency and quality of the wafers produced. However, systems that have high pressure (e.g., above 10 atm, above 15 atm, or up to 20 atm) are at high risk of breach and loss of containment. A system with enhanced safety features is beneficial for use of such ultra-high pressure processing.

Figure 1:
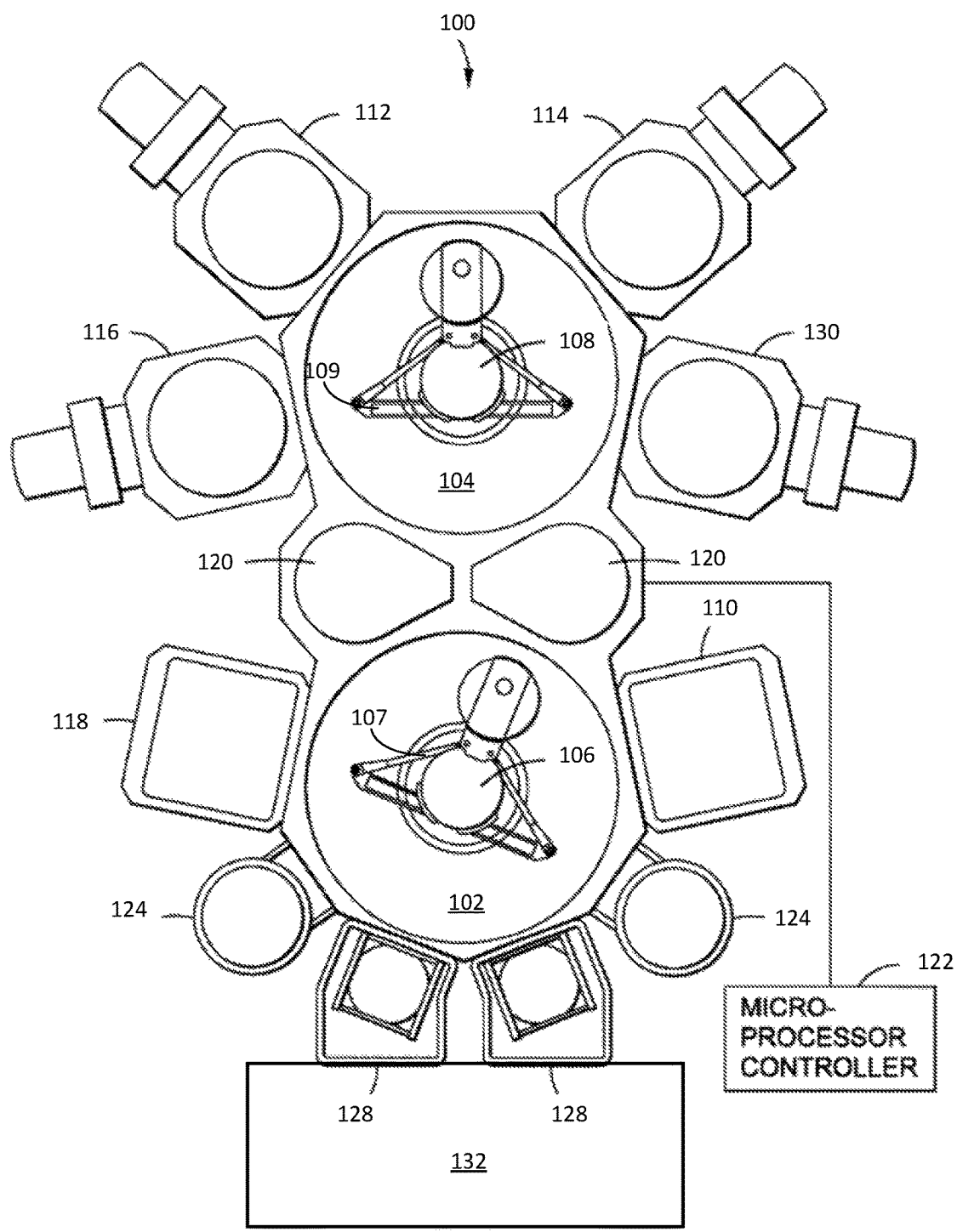
FIG. 1 is a diagram of a processing platform.

FIG. 1 shows an integrated multi-chamber substrate processing system suitable for performing at least one embodiment of physical vapor deposition, chemical vapor deposition, and/or annealing processes. In general, the multi-chamber substrate processing system includes at least one high-pressure processing chamber, e.g., able to operate at pressures above 40 atmospheres, to perform a high-pressure process such as deposition or annealing, and at least one low-pressure processing chamber, e.g., able to operate a low pressures, to perform a low-pressure process such as etching, deposition, or thermal treatment. In some implementations the multi-chamber processing system is a cluster tool having a central transfer chamber that is at low pressure and from which multiple processing chambers can be accessed.

Some embodiments of the processes and systems described herein relate to depositing layers of material, e.g., metal and metal silicide barriers, for feature definitions. For example, a first metal layer is deposited on a silicon substrate and annealed to form a metal silicide layer. A second metal layer is then deposited on the metal silicide layer to fill the feature. The annealing process to form the metal silicide layer may be performed in multiple annealing steps.

FIG. 1 is a schematic top view of one embodiment a processing platform 100 including two transfer chambers 102, 104, transfer robots 106, 108 positioned in the transfer chambers 102, 104, respectfully, and processing chambers 110, 112, 114, 116, 118, 130, disposed on the two transfer chambers 102, 104. The first and second transfer chambers 102, 104 are central vacuum chambers that interface with adjacent processing chambers 110, 112, 114, 116, 118, 130.

The first transfer chamber 102 and the second transfer chamber 104 are separated by pass-through chambers 120, which may comprise cooldown or pre-heating chambers. The pass-through chambers 120 also may be pumped down or ventilated during substrate handling when the first transfer chamber 102 and the second transfer chamber 104 operate at different pressures. For example, the first transfer chamber 102 may operate between about 100 milliTorr and about 5 Torr, such as about 40 milliTorr, and the second transfer chamber 104 may operate between about 1×10−5 Torr and about 1×10−8 Torr, such as about 1×10−7 Torr.

The processing platform 100 is operated by a programmed controller 122. The controller 122 can control the transfer robots 106, 108 to transport the workpieces between the chambers, and can cause each of the chambers of the processing platform 100 to perform individual operations to process the substrate.

The first transfer chamber 102 is coupled with two degas chambers 124, two load lock chambers 128, a reactive pre-clean chamber 118, at least one physical vapor deposition chamber 110, and the pass-through chambers 120. The pre-clean chamber may be a PreClean II chamber, commercially available from Applied Materials, of Santa Clara, Calif. Substrates (not shown) are loaded into the processing platform 100 through load lock chambers 128. For example, a factory interface module 132, if present, would be responsible for receiving one or more substrates, e.g., wafers, cassettes of wafers, or enclosed pods of wafers, from either a human operator or an automated substrate handling system. The factory interface module 132 can open the cassettes or pods of substrates, if applicable, and move the substrates to and from the load lock chambers 128. The processing chambers 110, 112, 114, 116, 118, 130 receive the substrates from the transfer chambers 102, 104, process the substrates, and allow the substrates to be transferred back into the transfer chambers 102, 104. After being loaded into the processing platform 100, the substrates are sequentially degassed and cleaned in degas chambers 124 and the pre-clean chamber 118, respectively.

Each of the processing chambers are isolated from the transfer chambers 102, 104 by an isolation valve which allows the processing chambers to operate at a different level of vacuum than the transfer chambers 102, 104 and prevents any gasses being used in the processing chamber from being introduced into the transfer chamber. The load lock chambers 128 are also isolated from the transfer chamber 102, 104 with isolation valves. Each load lock chamber 128 has a door which opens to the outside environment, e.g., opens to the factory interface module 132. In normal operation, a cassette loaded with substrates is placed into the load lock chamber 128 through the door from the factory interface module 132 and the door is closed. The load lock chamber 128 is then evacuated to the same pressure as the transfer chamber 102 and the isolation valve between the load lock chamber 128 and the transfer chamber 102 is opened. The robot in the transfer chamber 102 is moved into position and one substrate is removed from the load lock chamber 128. The load lock chamber 128 is preferably equipped with an elevator mechanism so as one substrate is removed from the cassette, the elevator moves the stack of wafers in the cassette to position another wafer in the transfer plane so that it can be positioned on the robot blade.

The transfer robot 106 in the transfer chamber 102 then rotates with the substrate so that the substrate is aligned with a processing chamber position. The processing chamber is flushed of any toxic gasses, brought to the same pressure level as the transfer chamber, and the isolation valve is opened. The transfer robot 106 then moves the wafer into the processing chamber where it is lifted off the robot. The transfer robot 106 is then retracted from the processing chamber and the isolation valve is closed. The processing chamber then goes through a series of operations to execute a specified process on the wafer. When complete, the processing chamber is brought back to the same environment as the transfer chamber 102 and the isolation valve is opened. The transfer robot 106 removes the wafer from the processing chamber and then either moves it to another processing chamber for another operation or replaces it in the load lock chamber 128 to be removed from the processing platform 100 when the entire cassette of wafers has been processed.

The transfer robots 106, 108 include robot arms 107, 109, respectively, that support and move the substrate between different processing chambers. The transfer robot 106 moves the substrate between the degas chambers 124 and the pre-clean chamber 118. The substrate may then be transferred to the long throw PVD chamber 110 for deposition of a material thereon.

The second transfer chamber 104 is coupled to a cluster of processing chambers 116, 112, 114, 130. The processing chambers 116, 112 may be chemical vapor deposition (CVD) chambers for depositing materials, such as tungsten, as desired by the operator. The PVD processed substrates are moved from the first transfer chamber 102 into the second transfer chamber 104 via the pass-through chambers 120.

Thereafter, the transfer robot 108 moves the substrates between one or more of the processing chambers 116, 112, 114, 130 for material deposition and annealing as required for processing.

Of course, all of the above is simply an exemplary implementation; each transfer chamber could have just a different number of processing chambers, e.g., one to five chambers, the processing chambers could have different distribution of functions, the system could have a different number of transfer chambers, e.g., just a single transfer chamber, and the transfer chambers could be omitted entirely and the system could have just a single stand-alone processing chamber.

Figure 2:
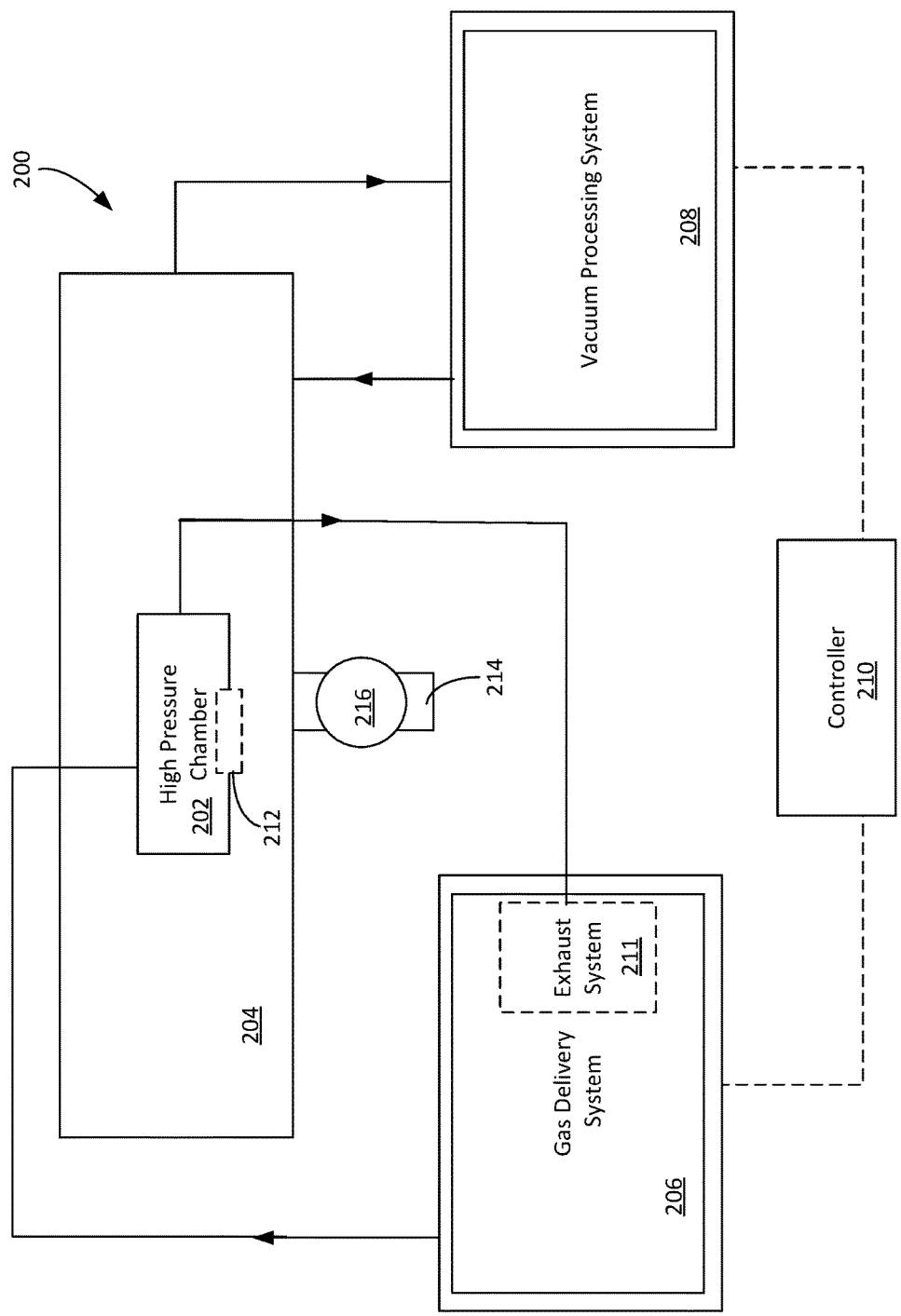
FIG. 2 is a diagram of a high-pressure system.

FIG. 2 illustrates a controlled high-pressure system 200 that creates a high-pressure environment for processing a substrate and a low-pressure environment for the substrate when the substrate is being transferred between processing chambers. The controlled high-pressure system 200 includes a first high-pressure chamber 202 and a second vacuum chamber 204. The first chamber 202 can correspond to one of the processing chambers 110, 112, 114, 116, 118, 130 of the processing platform 100, and the second chamber 204 can correspond to one of the transfer chambers 102, 104 of the processing platform 100. Alternatively, in some implementations, one of the processing chambers 110, 112, 114, 116, 118, 130 includes both the first chamber 202 and the second chamber 204. The first chamber 202 can correspond to an inner chamber, and the second chamber 204 can correspond to an outer chamber surrounding the inner chamber.

The pressure within the first chamber 202 can be controlled independently of the pressure in the second chamber 204. If the first and second chambers 202, 204 are distinct from the transfer chambers, the first and second chambers 202, 204 can have pressures that are controlled independently of the pressures within the transfer chambers. The controlled high-pressure system 200 further includes a gas delivery system 206, a vacuum processing system 208, and a controller 210. In some examples, the controller 122 of the processing platform 100 can include the controller 210.

The second chamber 204 is a relatively low pressure chamber adjacent to the first chamber 202. In some implementations, the second chamber 204 also surrounds the first chamber 202. The second chamber 204 can correspond to a transfer chamber, e.g., the transfer chamber 102 or the transfer chamber 104, which receives the substrate between different processing chambers. The low pressure environment of the second chamber 204 can inhibit contamination and/or oxidation of the substrate or the material deposited on the substrate.

The gas delivery system 206 is operated to pressurize and depressurize the first chamber 202. The first chamber 202 is a high-pressure processing chamber that receives a precursor gas from the gas delivery system 206 and establishes a high pressure, e.g., at a pressure of at least 10 atmospheres, (e.g., above 15 atm, above 20 atm). The precursor gas can react with the workpiece, e.g., a layer on the workpiece, or serve as a source for the material to be deposited on the workpiece. To pressurize the first chamber 202, the gas delivery system 206 introduces the precursor gas into the first chamber 202. The gas delivery system 206 can also introduce steam into the first chamber 202 to increase the pressure within the first chamber 202.

The gas delivery system 206 includes an exhaust system 211 to exhaust the precursor gas and steam from the first chamber 202, thereby depressurizing the first chamber 202. The vacuum processing system 208 is operated to control the pressure of the second chamber 204 to be at a vacuum or near-vacuum pressure, e.g., less than 1 milliTorr. The vacuum processing system 208 lowers a pressure within the second chamber 204 to near vacuum, thereby creating the appropriate low pressure environment for transfer of the substrate. During operation, the ultra-high pressures achieved in the first chamber 202 (e.g., above 10 atm, above 15 atm) require a corresponding higher pressure in the second chamber 204 (below about 1 atm (e.g., approximately 0.85 atm or 640 torr).

A valve assembly 212 between the first chamber 202 and the second chamber 204 isolates the pressure within the first chamber 202 from the pressure within the second chamber 204. The high-pressure environment within the first chamber 202 can thus be separated and sealed from the low pressure environment within the second chamber 204. The valve assembly 212 is openable to enable the substrate to be transferred from the first chamber 202 directly into the second chamber 204 or to enable the substrate to be transferred from the second chamber 204 directly into the first chamber 202.

The high-pressure system 200 includes a foreline 214 connected to a transfer chamber, e.g., one of the transfer chambers 102, 104, and connected to an outside environment. An isolation valve 216 is arranged along the foreline 214 to isolate the pressure within the second chamber 204 from the pressure of the outside environment. The isolation valve 216 can be operated to adjust the pressure within the second chamber 204 and to release gases within the second chamber 204. The isolation valve 216 can be operated in conjunction with the vacuum processing system 208 to regulate the pressure within the second chamber 204. The isolation valve 216 can be operated in conjunction with the gas delivery system 206 and exhaust system 211 to increase the overall safety of the high-pressure system 200 at multipole points.

Figure 3:
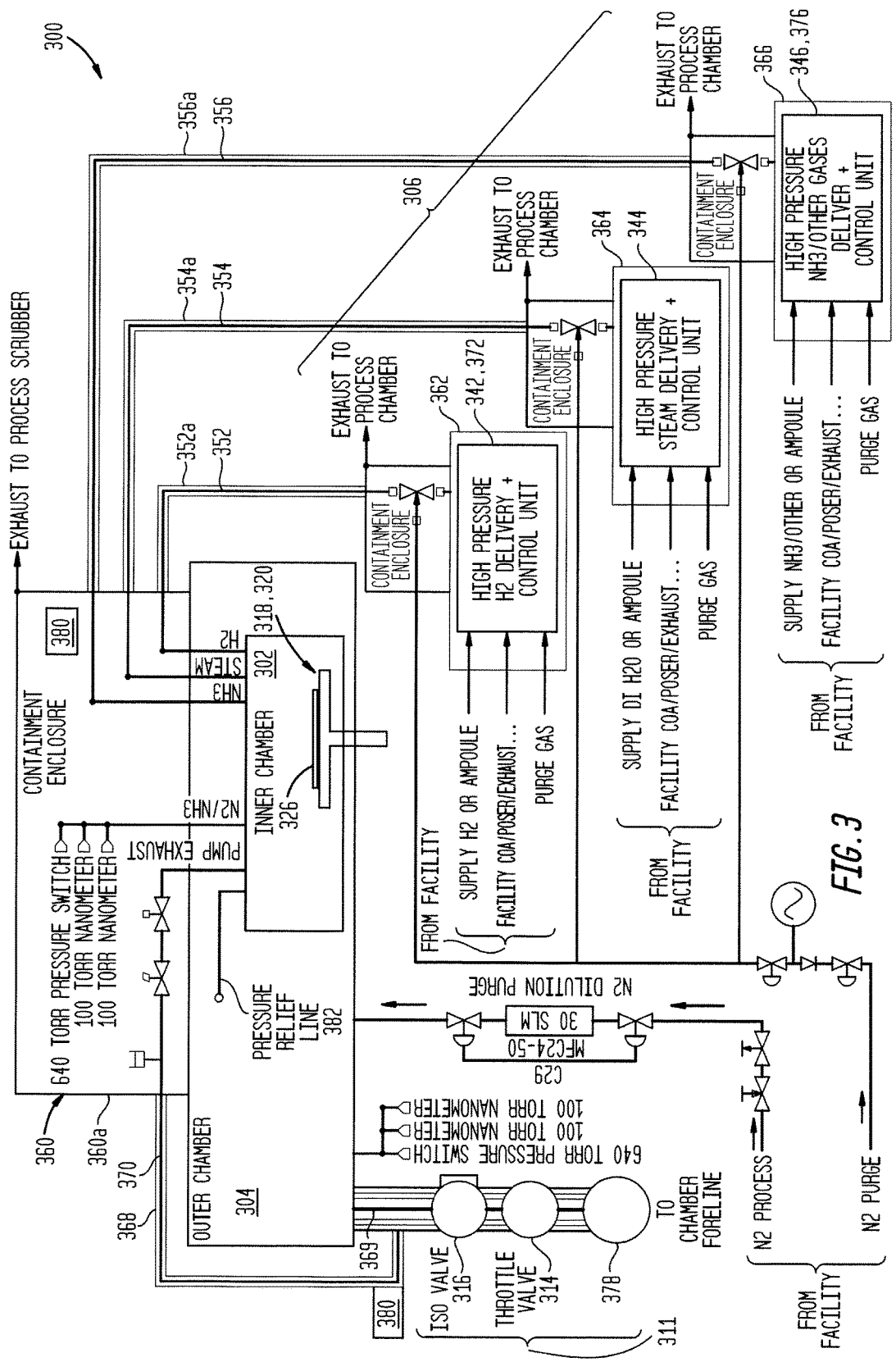
FIG. 3 is a diagram of a high-pressure system with enhanced safety features.

FIG. 3 is a schematic diagram a high-pressure processing system that includes pressure isolation for increased safety. Referring to FIG. 3, one embodiment of a high-pressure system 300 includes a first chamber 302 a second chamber 304 as described with respect to FIGS. 1 and 2. The first chamber 302 and second chamber 304 can be similar to the first chamber 202 and second chamber 204, except as described below.

The inner chamber includes a pedestal 318 that supports a substrate 326 which is to be processed, e.g., subject to annealing or on which a layer of material is to be deposited. The pedestal 318 is positioned or positionable within the first chamber 302. In some implementations, the substrate 326 sits directly on a flat top surface of the pedestal 318. In some implementations, the substrate 326 sits on lift pins that project from the pedestal 318.

A gas delivery system 306 is operated to pressurize and depressurize the first chamber 302 that receives gas from the gas delivery system 306 and establishes a high pressure, e.g., at a pressure of up to 75 or 80 psi. To pressurize the first chamber 302, the gas delivery system 306 introduces the gas into the first chamber 302. The gas is supplied from a first processing gas delivery module 342 to deliver a first high pressure gas and/or from a second processing gas delivery module 346 to deliver a second pressure gas of different composition that the first high pressure gas. The first gas can be $H_2$; the first processing gas delivery module 342 is a high pressure $H_2$ gas delivery module. The second gas can be $NH_3$; the first processing gas delivery module 345 is a high pressure $NH_3$ gas delivery module 346. The gas delivery system 306 can also introduce steam into the first chamber 302 supplied from high pressure steam delivery module 344 to increase the pressure within the first chamber 302. The delivery modules 342, 344, 346 are connected to facility supplies or gas tanks that supply the respective gases. The delivery modules 342, 344, 346 are connected to the first chamber 302 by a first delivery line 352, second delivery line 354, and third delivery line 356.

The first high pressure gas delivery module 342 includes a first pump 372 and the second high pressure gas delivery module 346 has a second pump 376. The first pump 372 integrated into the first delivery module 342 increases the pressure of the incoming first gas, e.g., the hydrogen gas. The first gas can be supplied to the first gas delivery module 342 at a relatively low pressure, e.g., 25-40 psi (approximately 1.7-2.7 atm). The first pump 372 can increase the pressure by an order of magnitude, in some cases up as high as 750 psi.

Similarly, the second pump 376 integrated into the second delivery module 346 increases the pressure of the incoming second gas, e.g., the ammonia gas. The gas can be supplied to the second delivery module 346 at a relatively low pressure and the second pump 376 can increase the pressure, e.g., above 10 atm, above 15 atm, or as high as 50 atm. The first gas delivery module 342 and the second gas delivery module 346 each have separate pumps 372, 376. In some instances only one pump is necessary and is included in the system 300.

The first gas delivery module 342 and the second gas delivery module 346 with their respective pumps 372, 376 as well as the steam delivery module 344 are contained in separate housings 362, 366, and 364 respectively. In some implementations, the respective housings can be both physically and fluidly unconnected to enhance the safety of the system 300.

To further increase the safety of the system 300, each of the delivery modules 342, 344, 346 are enclosed within a containment assembly. The containment assembly includes at least a containment enclosure 360 that encloses the connections of the delivery lines 352, 354, 356 to the chambers 302, 304.

In some implementations, the containment assembly includes multiple parts each of which is a pressure-containing enclosure that surrounds and encapsulates a respective gas delivery module. For example, the first gas delivery module 342 can be enclosed in a first containment enclosure, the steam delivery module 344 in a second enclosure and the second gas delivery module in a third enclosure. In some instances, these physically separate sub-parts of containment assembly can correspond to the housings 362, 364, 366.

Alternatively, e.g., as shown in FIG. 3, the delivery modules 342, 344, 346 can be enclosed by a common containment enclosure 360. In this case, the housings 362, 364, 366 can be portions of the common containment enclosure 360. The housing 362, 364, 366 can be coupled to the portion 360a of the containment enclosure 360 that encloses the connections of the delivery lines 352, 354, 356 to the chambers 302, 304. In particular, the delivery lines 352, 354, 356 can be enclosed in respective conduits 352a, 354a, 356a that extend between the housings 362, 364, 366, respectively, and the portion 360a.

The containment enclosure 360 can also include the outer chamber 304, and can be fluidly connected to the exhaust system 311 that exhausts the gas and steam from the second chamber 304. The exhaust system 311 includes isolation valve 316 and foreline 314.

The containment enclosure 360 can also include a containment exhaust line 368. The containment exhaust line 368 encloses the exhaust line 370 for the first chamber 302 that connects the first chamber 302 to the exhaust system 311. The containment exhaust line 368 surrounds the exhaust line 370 and connects the containment enclosure 360 to the exhaust system 311.

A breach in any of the pressurized components within the containment enclosure 360 can be contained by containment enclosure 360. In some instances the breaching gases are funneled by exhaust line 368 to the foreline 314, where the breaching gases can be safely vented from the system 300.

Each one of the delivery lines 352, 354, 356 are themselves contained within containment enclosure 360, and each line delivery line 352, 354, 356 has a pressure relief line within the containment enclosure 360. Any pressure buildup inside delivery lines 352, 354, 356 that is released by the pressure relief line will flow into the containment enclosure 360 and be removed from the system 300, e.g., by containment exhaust line 368, or in some instances via separate exhaust channels 369 connected to exhaust system 311.

The system 300 also includes a pressure relief line 382 that is coupled to the inner chamber 302. If the pressure in the inner chamber 302 exceeds permissible levels, gas that is released by the pressure relief line 382 will flow into the outer chamber 304 and be removed from the system 300 by the exhaust line 369, or flow into the containment enclosure 360 and be removed from the system 300 by containment exhaust line 368, or in some instances via separate exhaust channels connected to exhaust system 311.

Thus, all pressurized components can be contained within containment enclosure 360 so that the system 300 can relieve unexpected leaks, ruptures, or breaches without ever exposing pressurized gas the atmosphere.

Multiple chemical sensors 380, e.g., gas sensors, are included in the system 300. In particular, due to volatility, the gas sensors can be hydrogen sensors. A gas sensor 380 is integrated into possible leak locations, e.g., inside containment enclosure 360, and inside exhaust line 368. If any hydrogen sensor 380 detects a hydrogen leak, the controller will detect the signal from the sensor 380 and will shut off the pumps 372, 366.

In some instances, the containment enclosure 360 connects to the foreline 314, which in turn connects to a dry line pump 378. If one of the pressurized units, e.g., delivery lines 352, 354, 356, leaks, the leaking gas is delivered to the foreline 314 and the gas then flows through the dry line pump 378. To accommodate the pressure (e.g., prevent the high pressure from breaching the dry line pump 378) the gas is expanded before reaching the dry line pump 378. In some instances the gas flows through a large diameter diffuser, e.g., 20 inch by 5 ft. tall diffuser.

The second chamber 304 is maintained at a lower pressure than the first chamber 302, for example at approximately 12 psi. Any leaks in the second chamber 304 are also routed through the dry line pump 378.

To treat or deposit a layer of material on the substrate 326, the controller can operate the vacuum processing system to depressurize the second chamber 304 to a low-pressure state, e.g., to a state in which the second chamber 304 has a pressure less than 1 atmosphere, to prepare for transfer of the substrate 326 through the second chamber 304. The low-pressure state can be a near-vacuum state, e.g., a pressure less than 1 milliTorr. The substrate 326 is moved through the second chamber 304 by a transfer robot, e.g., one of the transfer robots 106, 108 in FIG. 1, while the second chamber 304 is at the low-pressure so that contamination and oxidation of the substrate 326 can be inhibited.

The substrate 326 is transferred into the first chamber 302 for processing. To transfer the substrate 326 into the first chamber 302, the controller can operate the valve assembly 212, e.g., open the valve assembly 212 to provide an opening through which the substrate 326 can be transferred into the first chamber 302. The controller can operate the transfer robot to carry the substrate 326 into the first chamber 302 and to place the substrate 326 on the pedestal 318.

After the substrate 326 is transferred into the first chamber 302, the controller can operate the valve assembly 212 to close the opening, e.g., close the valve assembly 212, thereby isolating the first and second chambers 302, 304 from one another. With the valve assembly 212 closed, pressures in the first chamber 302 and the second chamber 304 can be set to different values. The controller can operate the gas delivery system 306 to introduce the gas into the first chamber 302 to pressurize the first chamber 302 and to deposit the layer of material onto the substrate 326. The introduction of the gas can increase the pressure within the first chamber 302 to, for example, 10 atmospheres or more.

The gas can be an annealing gas that reacts with the layer on the substrate 326. Alternatively, the gas can include the material to be deposited onto the substrate 32. The proper temperature and pressure conditions in the first chamber 302 can cause the annealing or deposition of the material to occur. During processing, e.g., annealing or deposition, the controller can operate the one or more heating elements 320 on the pedestal 318 to add heat to the substrate 326 to facilitate processing of the layer of material on the substrate 326.

When processing of the layer of material on the substrate 326 is complete, the substrate 326 can be removed from the first chamber 302 using the transfer robot and, if necessary, transferred to a subsequent process chamber. To prepare for transfer of the substrate 326 out of the first chamber 302, the controller can operate the exhaust system of the gas delivery system 306 to depressurize the first chamber 302 before the valve assembly 212 is opened. In particular, before the substrate 326 is transferred out of the first chamber 302, the gas is exhausted from the first chamber 302 to reduce the pressure within the first chamber 302. The pressure can be reduced to a near-vacuum pressure such that the pressure differential between the first chamber 302 and the second chamber 304 can be minimized.

The valve assembly 212 between the first chamber 202 and the second chamber 204 isolates the pressure within the first chamber 202 from the pressure within the second chamber 204. The high-pressure environment within the first chamber 202 can thus be separated and sealed from the low pressure environment within the second chamber 204. The valve assembly 212 is openable to enable the substrate to be transferred from the first chamber 202 directly into the second chamber 204 or to enable the substrate to be transferred from the second chamber 204 directly into the first chamber 202.

Figure 4:
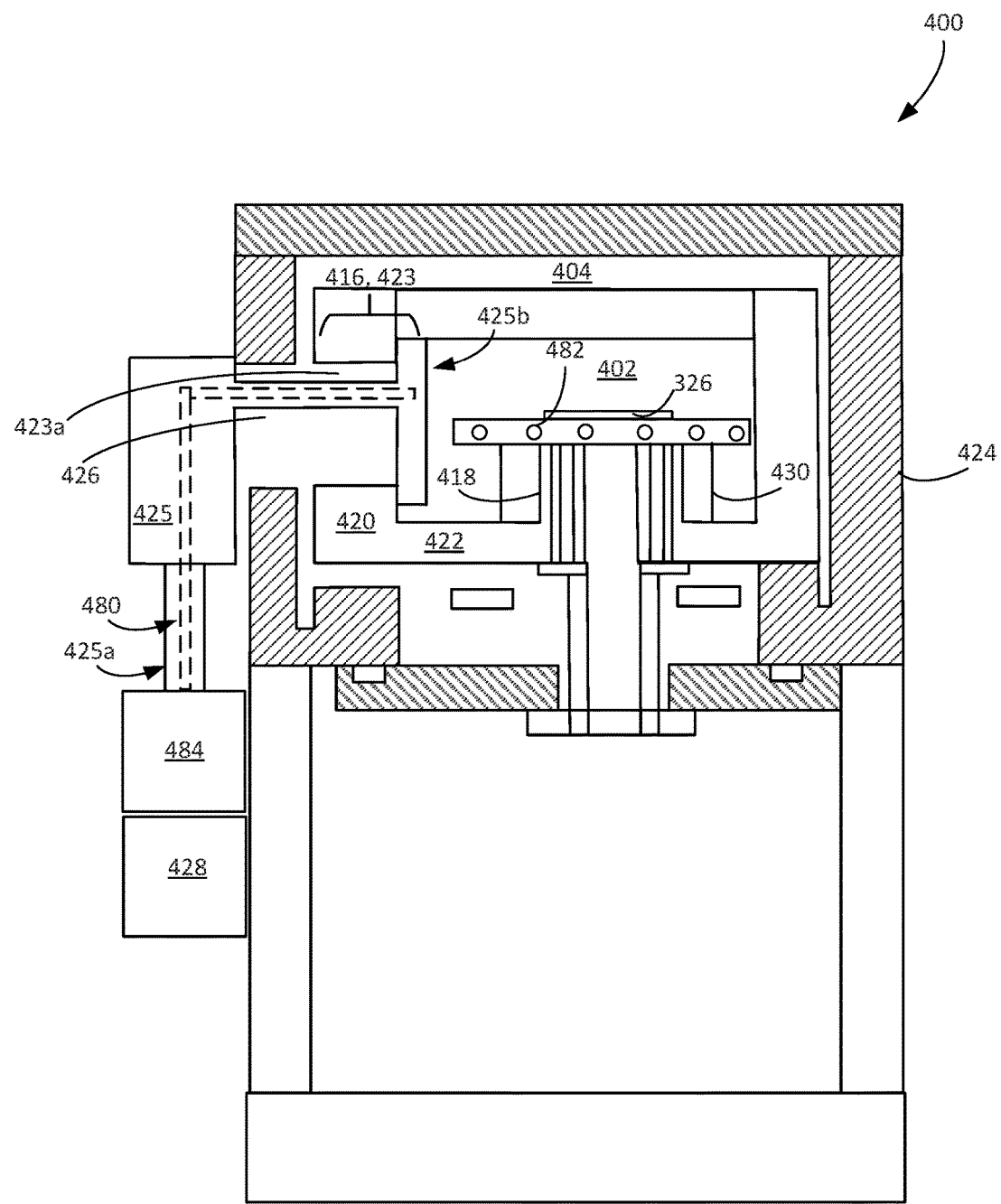
FIG. 4 is a schematic side view of an example of a high-pressure deposition system.

Referring to FIG. 4, a high-pressure deposition system 400 further includes a valve assembly 416 between the first chamber 402 and the second chamber 404 that, similar to the valve assembly 212 of FIG. 2, isolates the first chamber 402 from the second chamber 404. The second chamber 404 can be defined by volume between inner walls 420 and outer walls 424. In addition, a substrate 326 is also supportable on a pedestal 418 that has heater elements 482. The substrate can sit directly on the pedestal 418, or sit on a lift pin assembly 430 that extend through the pedestal.

The valve assembly 416 is formed by an arm 425 movable relative to the inner walls 420 and the base 422 of the first chamber 402. The arm 425 can movable relative to the outer walls 420 and the base 422 of the first chamber 402. In particular, the valve assembly 416 includes a slit valve 423 between the first chamber 402 and the second chamber 404. The slit valve 423 includes a slit 423a and the arm 425. The slit 423a extends through one of the inner walls 420 of the first chamber 402. A vertical end 425a of the arm 425 is positioned outside of the first chamber 402 while a horizontal end 425b of the arm 425 is positioned within the first chamber 402. The vertical end 425a of the arm 425 can be positioned within the second chamber 404 and be driven by an actuator positioned within the second chamber 404. Alternatively, the vertical end 425a of the arm 425 is positioned outside of the second chamber 404 and is thus driven by an actuator 428 that is also positioned outside of the second chamber 404.

The arm 425 extends through the slit 423a and is movable relative to the walls 420 so that the arm 425 can be moved to a position in which it forms a seal with the walls 420. The actuator 428 is coupled to the vertical end 425a of the arm 425 and drives the horizontal end 425b of the arm 425 relative to the walls 420. The arm 425 is movable vertically to cover or uncover the slit 423a. In particular, the vertical end 425a of the arm 425 can be or include a flange that extends substantially parallel to the adjacent inner surface of the inner wall 420. The arm 425 can also be driven laterally so that the horizontal end 425b of the arm 425 can engage or disengage the wall 420. The arm 425 can also extend through an aperture 426 in the outer wall 424.

The valve assembly 416 is movable between an open position and a closed position. When the valve assembly 416 is in the open position, the horizontal end 425b of the arm 425 is spaced laterally apart from the wall 420, e.g., the inner surface of the wall 420. In addition, the horizontal end 425b of the arm 425 is positioned vertically so that the slit 423a is uncovered. The slit 423a thus provides an opening that enables fluidic communication between the first chamber 402 and the second chamber 404 and that also enables the substrate 326 to be moved in and out of the first chamber 402, e.g., by a robot as discussed above. When the valve assembly 416 is in the closed position, the horizontal end 425b of the arm 425 covers the slit 423a and contacts one of the walls 420, thereby forming the seal to isolate the first chamber 402 from the second chamber 404. When pressurized, the flange or horizontal end 425b contacts an inner surface of the wall 420 defining the first chamber 402. An O-ring is placed along the circumference of the horizontal end 425b on the surface that contacts the wall 420, helping to reinforcing the seal of containment when the first chamber 402 is pressurized.

The heat elements 484 in the pedestal 418 heat the gas in the first chamber 402 to up to 250° C. To prevent damage to the O-ring, the arm 425 includes internal gas channel 480. The internal gas channel 480 is supplied from cooling gas supply 484 and is a conduit to let the cooling gas flow through the arm 425. The internal gas channel 480 can extend through the horizontal end 425b, or through both the horizontal end 425b and the vertical end 425a. The internal gas channel and cooling gas supply 484 can be configured such that when the valve assembly 416 is in the open position no gas is available from the cooling gas supply 484, preventing cooling gas flow when transfer of the substrate is occurring.

Figure 5:
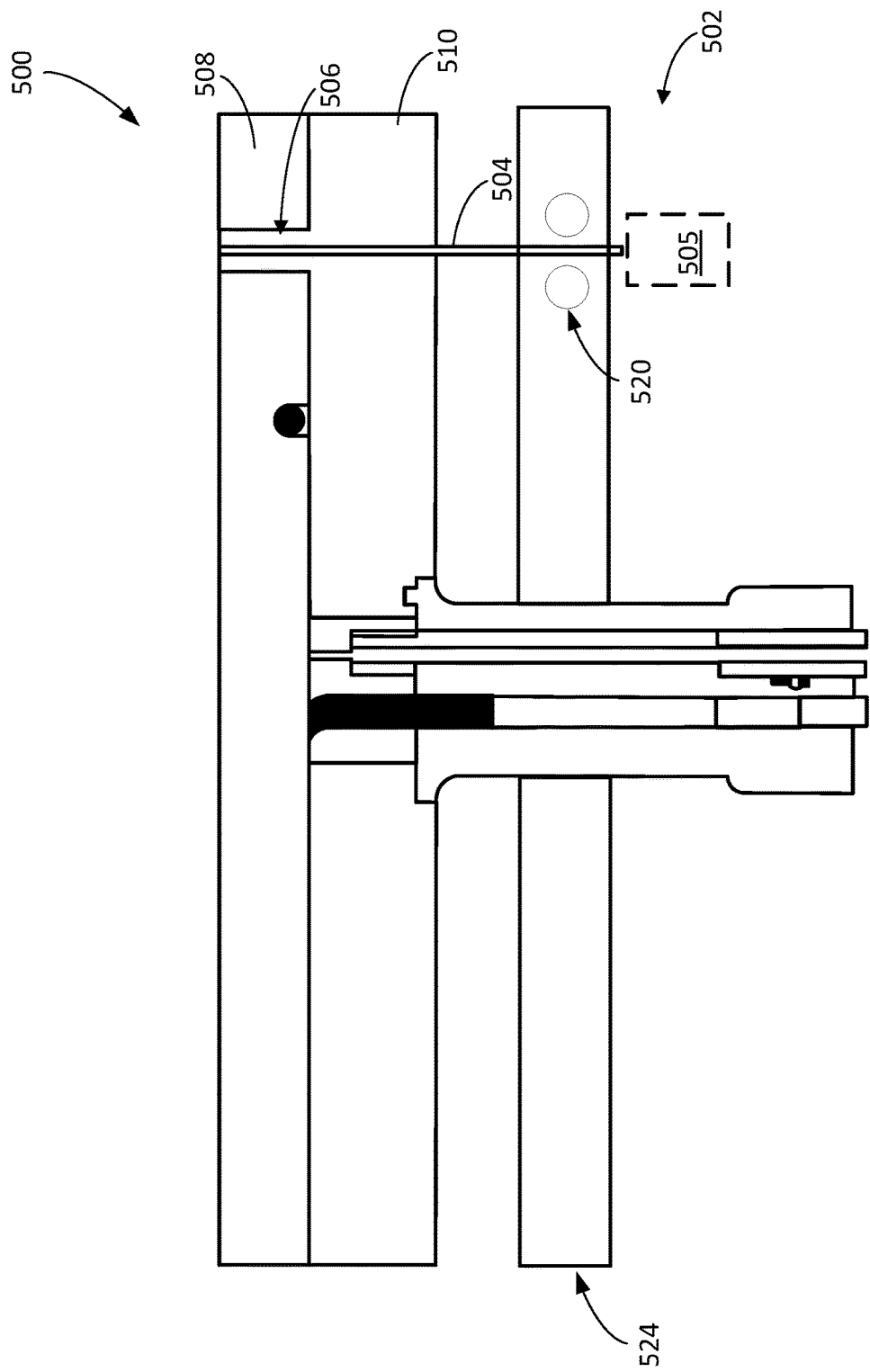
FIG. 5 is a schematic side view of a pedestal.

Referring to FIG. 5, the lift pin assembly 430 can be integrated into a pedestal 500 with heating elements. The pedestal 500 can, for example, correspond to one of the pedestals 418 described. The pedestal 500 includes a lift pin assembly 502 (e.g., lift pin assembly 430) having a lift pin 504, which is disposed at least partially in an opening 506 defined in plates 508, 510. The lift pin 504 is used to lift the substrate from the pedestal 500 such that a transfer robot, e.g., one of the transfer robots 106, 108, can access and move the substrate out of a chamber. The lift pin 504 is driven by an actuator 505 from a first position in which the lift pin 504 is recessed within the pedestal 500 to a second position in which the lift pin 504 protrudes from the pedestal 500.

Due to the radiation and conduction from the pedestal, the area around the lift pin assembly 502 will be hot, e.g., 150° C. or 200° C. Various cooling mechanisms for the lift pin assembly 502 are possible. In one example, the walls 524 can have gas channels 520 that bring cooling gas (e.g., H2 at below 100° C.) to the region of the lift pin assembly 502.

A number of embodiments of the invention have been described. Nevertheless, it will be understood that various modifications may be made without departing from the spirit and scope of the invention. For example, while the foregoing describes the formation of a metal silicide layer from a cobalt or nickel layer film, in some implementations, other materials can be used. For example, other materials can include titanium, tantalum, tungsten, molybdenum, platinum, iron, niobium, palladium, and combinations thereof, and other alloys including nickel cobalt alloys, cobalt tungsten alloys, cobalt nickel tungsten alloys, doped cobalt and nickel alloys, or nickel iron alloys, to form the metal silicide material as described herein.

Although described above in the context of a deposition system, depending on the gasses provided, the high-pressure chamber can be used for an etching system. Alternatively, the high-pressure chamber can be filled with an inert gas, and the high-pressure chamber can be used purely for heat treatment at high pressure. The processing platforms described herein can include other types of processing chambers. For example, a processing platform can include an etching chamber to etch patterns onto a surface of a substrate.

Each of the different chambers of a processing platform can have varying pressure environments, ranging from near-vacuum to more than 50 atmospheres. The isolation valves, e.g., vacuum valves, between the chambers can isolate the pressures from one another such that these varying pressure environments can be maintained within each chamber.

Accordingly, other embodiments are within the scope of the following claims.

What is claimed is:
1. A high-pressure processing system for processing a layer on a substrate, the system comprising:
 a first chamber;
 a support to hold the substrate in the first chamber;
 a second chamber adjacent the first chamber;
 a foreline to remove gas from the second chamber;
 a vacuum processing system configured to lower a pressure within the second chamber to near vacuum;
 a valve assembly between the first chamber and the second chamber to isolate the pressure within the first chamber from the pressure within the second chamber;
 a gas delivery system configured to introduce a gas into the first chamber and to increase the pressure within the first chamber to at least 10 atmospheres while the gas is in the first chamber and while the first chamber is isolated from the second chamber;
 a controller configured to operate the gas delivery system and the valve assembly;

an exhaust system comprising an exhaust line to remove gas from the first chamber; and a containment enclosure surrounding a portion of the gas delivery system and the exhaust line, the containment enclosure configured to divert gas leaking from the portion of the gas delivery system and the exhaust line to the foreline.

2. The system of claim 1, wherein the gas delivery system comprises a first pump configured to increase pressure of the gas before delivering the gas to the first chamber.

3. The system of claim 2, wherein the portion of the gas delivery system surrounded by the containment enclosure comprises the first pump, and delivery lines connecting the first pump and the first chamber.

4. The system of claim 1, comprising a second gas delivery system configured to introduce a second gas into the first chamber and to increase the pressure within the first chamber to at least 10 atmospheres while the second gas is in the first chamber and while the first chamber is isolated from the second chamber.

5. The system of claim 4, wherein the second gas delivery system comprises a second pump configured to increase pressure of the second gas to at least 40 atmospheres before delivering the second gas to the first chamber.

6. The system of claim 1, wherein the gas delivery system comprises a steam delivery system that introduces steam to the first chamber.

7. The system of claim 1, wherein the foreline is connected to a dry line pump and a diffuser configured to reduce the pressure of the gas before reaching the dry line pump.

8. The system of claim 1, further comprising a hydrogen sensor inside the containment enclosure, and wherein the controller is configured to shut off the second pump if the controller receives a signal from the hydrogen sensor indicating a hydrogen leak.

9. The system of claim 1, further comprising a vacuum processing system configured to generate a pressure within the second chamber, the pressure being less than 1 atmosphere.

10. The system of claim 1, further comprising a robot arm configured to transfer the substrate through the valve assembly from the first chamber to the second chamber.

11. The system of claim 1, wherein the valve assembly comprises a slit valve between the first chamber and the second chamber.

12. The system of claim 11, wherein the slit valve comprises a slit through a wall between the first chamber and the second chamber, and an arm movable between a first position in which the arm covers the slit to form a seal between the first chamber and the second chamber and a second position in which the slit is uncovered and the substrate is transferrable through the slit valve from the first chamber to the second chamber.

13. The system of claim 12, wherein the arm is configured to engage an inner surface of the wall defining the first chamber in the first position to compress an O-ring an form the seal between the first chamber and the second chamber.

14. The system of claim 12, further comprising an actuator to move the arm relative to the slit, the actuator being coupled to an end of the arm outside of the second chamber.

15. The system of claim 12, further comprising a gas channel internal to the arm, the gas channel connected to a cooling gas source on a first end.

16. The system of claim 1, further comprising a lift pin assembly to lift the substrate from the support.

17. The system of claim 16, further comprising a cooling channel to deliver cool gas near the lift pin assembly and cool the lift pin assembly.

18. A semiconductor fabrication apparatus, comprising:
a central vacuum chamber having a robot positioned therein;
a factory interface module coupled to the central vacuum chamber;
a low-pressure processing chamber coupled to the central vacuum chamber by a first vacuum valve;
the high-pressure deposition system of claim 1, wherein the second chamber is coupled to the central vacuum chamber by a second vacuum valve.

* * * * *